(12) United States Patent
Suzuki

(10) Patent No.: US 9,761,423 B2
(45) Date of Patent: Sep. 12, 2017

(54) SPUTTERING APPARATUS AND MAGNET UNIT

(71) Applicant: CANON ANELVA CORPORATION, Kawasaki (JP)

(72) Inventor: Hidekazu Suzuki, Kawasaki (JP)

(73) Assignee: Canon Anelva Corporation, Kawasaki-shi (JP)

( * ) Notice: Subject to any disclaimer, the term of this patent is extended or adjusted under 35 U.S.C. 154(b) by 256 days.

(21) Appl. No.: 14/579,290

(22) Filed: Dec. 22, 2014

(65) Prior Publication Data

US 2015/0107992 A1    Apr. 23, 2015

Related U.S. Application Data

(63) Continuation of application No. PCT/JP2013/001722, filed on Mar. 14, 2013.

(30) Foreign Application Priority Data

Jul. 11, 2012  (JP) ................................. 2012-155522

(51) Int. Cl.
*C23C 14/00* (2006.01)
*H01J 37/34* (2006.01)
*H01F 7/02* (2006.01)

(52) U.S. Cl.
CPC ............ *H01J 37/345* (2013.01); *H01F 7/021* (2013.01); *H01F 7/0221* (2013.01); (Continued)

(58) Field of Classification Search
CPC .................................................. H01J 37/345
See application file for complete search history.

(56) References Cited

U.S. PATENT DOCUMENTS 5,262,028 A * 11/1993 Manley ............... H01J 37/3452
                                                         204/192.12
2003/0209431 A1* 11/2003 Brown ................ H01J 37/3452
                                                         204/298.19
(Continued)

FOREIGN PATENT DOCUMENTS

CN       102199754 A      9/2011
CN       102453882 A      5/2012
(Continued)

OTHER PUBLICATIONS

Notification of First Office Action and First Office Action issued in Chinese Application No. 201380036961.1, dated Dec. 16, 2015 (10 pages).

(Continued)

*Primary Examiner* — Timon Wanga
(74) *Attorney, Agent, or Firm* — Fitzpatrick, Cella, Harper & Scinto

(57) ABSTRACT

A sputtering apparatus comprises: a target holder; and a magnet unit of a rectangular shape having long and short sides. The magnet unit includes: a first magnet; a second magnet disposed surrounding the first magnet and magnetized in a different and opposite direction from a direction of magnetization of the first magnet, and a third magnet located at part between the first magnet and the second magnet in the short-side direction and at least at a center position between the first magnet and the second magnet, the third magnet being magnetized in the short-side direction. In the third magnet, a surface facing the second magnet has the same polarity as that of a surface of the second magnet on the target holder side, and a surface facing the first magnet has the same polarity as that of a surface of the first magnet on the target holder side.

14 Claims, 7 Drawing Sheets

(52) U.S. Cl.
CPC ...... *H01J 37/3405* (2013.01); *H01J 37/3452* (2013.01); *H01J 37/3461* (2013.01); *H01J 2237/332* (2013.01)

(56) References Cited

U.S. PATENT DOCUMENTS

| | | | |
|---|---|---|---|
| 2010/0230282 A1* | 9/2010 | Kondo | C23C 14/35 204/298.12 |
| 2012/0111724 A1* | 5/2012 | Kobayashi | H01J 37/3405 204/298.17 |
| 2012/0175251 A1* | 7/2012 | Crowley | C23C 14/35 204/298.16 |

FOREIGN PATENT DOCUMENTS

| | | |
|---|---|---|
| JP | 4-187766 A | 7/1992 |
| JP | 6-192833 A | 7/1994 |
| JP | 10-88339 A | 4/1998 |
| JP | 10-512326 A | 11/1998 |
| JP | 11-158625 A | 6/1999 |
| JP | 2000-239841 A | 9/2000 |
| JP | 2005-8917 A | 1/2005 |
| JP | 2005-139521 A | 6/2005 |
| JP | 2008-156735 A | 7/2008 |
| WO | 96/21750 A1 | 7/1996 |

OTHER PUBLICATIONS

Office Action issued in counterpart Korean Application No. 10-2015-7000297 dated May 20, 2016 (10 pages).
International Search Report issued in PCT/JP2013/001722 dated Jun. 25, 2013 (4 pages).

* cited by examiner

FIG. 10
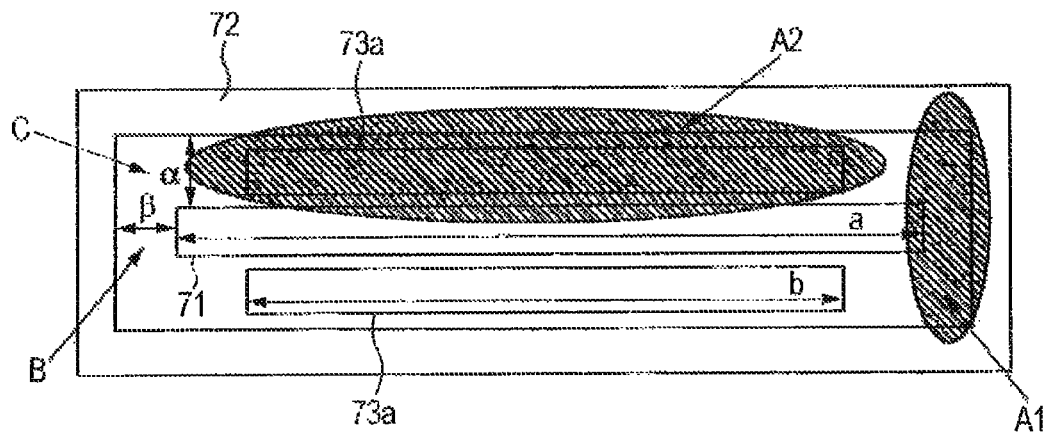
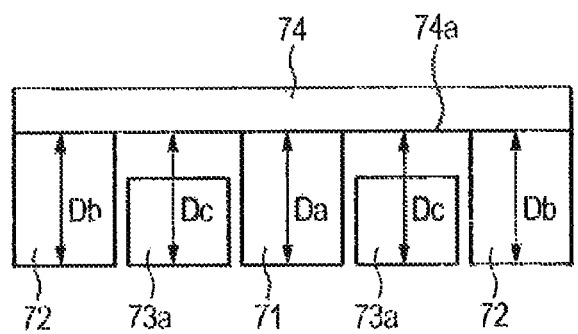
FIG. 11A
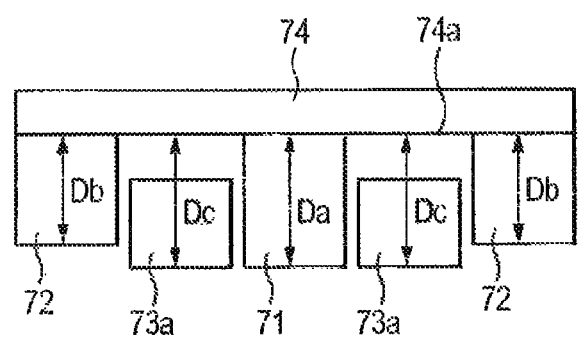
FIG. 11B
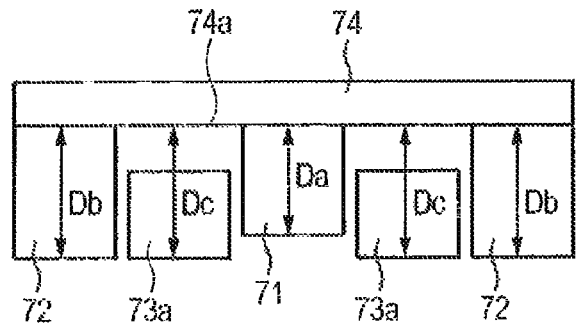
FIG. 11C

SPUTTERING APPARATUS AND MAGNET UNIT

CROSS-REFERENCES TO RELATED APPLICATIONS

This application is a continuation application of International Application No. PC/JP2013/001722, filed Mar. 14, 2013, which claims the benefit of Japanese Patent Application No. 2012-155522 filed Jul. 11, 2012. The contents of the aforementioned applications are incorporated herein by reference in their entireties.

TECHNICAL FIELD

The present invention relates to a sputtering apparatus and a magnet unit, or more specifically to a sputtering apparatus including a magnetron cathode and to a magnet unit provided in the magnetron cathode.

BACKGROUND ART

As a sputtering apparatus using a magnetron cathode, there has been heretofore disclosed an apparatus configured to swing a magnet unit in order to expand an erosion region of a target and to improve a target utilisation rate. For example, Patent Document 1 discloses a sputtering apparatus, which includes a flat-plate-like target holder having a substantially rectangular shape, and is equipped with a planar magnetron cathode configured to swing a magnet unit having a substantially rectangular shape.

CITATION LIST

Patent Document

Patent Document 1: Japanese Patent Application Laid-Open No. Hei 10-88339

SUMMARY OF INVENTION

However, there is a demand for a further improvement in the target utilization rate.

Here, an erosion shape of a target and a target utilization rate in the case of swinging a rectangular magnet unit relative to the target will be described with reference to FIGS. 5A, 5B, and 6.

FIGS. 5A and 5B are schematic diagrams showing the region and shape of erosion formed in the target when the substantially rectangular magnet unit is stationary relative to the target. FIG. 5A is a plan view showing erosion formed in the target. In FIG. 5A, erosion 50 represents an erosion region on an xy plane which is a target surface. Since magnetron discharge is carried out, the region of the erosion 50 is formed into an endless ring shape as shown in FIG. 5A. FIG. 5B is a cross-sectional view taken along the VB-VB line in FIG. 5A, which shows a cross-sectional shape of the erosion 50. In FIG. 5B, two valleys of the erosion 50 are arranged side by side along the VB-VB line in FIG. 5A, i.e., in a direction perpendicular to the long side of the substantially rectangular magnet unit and perpendicular to the target surface.

FIG. 6 is a cross-sectional view showing simulation results of the shapes of the erosion formed in the target when the substantially rectangular magnet unit is stationary relative to the target and when the substantially rectangular magnet unit is swinging relative to the target. In the following, the erosion formed in the target when the magnet unit is stationary relative to the target will be referred to as stationary erosion 50 while the one formed when the magnet unit is swinging relative to the target will be referred to as swinging erosion 51.

In FIG. 6, a dashed line and a dotted line of the erosion 50 illustrated on the left and right in the drawing and each including the two valleys show profiles of the virtual stationary erosion to be formed in the target when a magnet unit 700 is located at a left end and a right end relative to the target, respectively. In FIG. 6, the magnet unit 700 swings in a short-side direction of the magnet unit 700. As the magnet unit 700 swings in a zone L relative to the target, the stationary erosion 50 shifts relative to the target, and thus the swinging erosion 51 is formed in the target. Note that each of the stationary erosion 50 and the swinging erosion 51 is indicated with its relative erosion depth, which is normalized using its largest erosion depth.

As clear from FIG. 6, the swinging erosion 51 is broadly divided into a region A where the stationary erosion 50 passes through the target entirely along with the swing, and regions B where the stationary erosion 50 passes through the target only partially along with the swing. In other words, two end portions of the target in the short-side direction of the magnet unit, which are indicated as the regions B in FIG. 6, are not efficiently utilised but are left unsputtered.

The inventor of the present application has devised a method including making a magnet width smaller than that in a conventional method in order to efficiently utilize the two end portions of the target where the erosion is not sufficiently formed and the target is left unsputtered, and thereby to further improve the target utilization rate. Using FIG. 6, a description will be given as to how much the target utilization rate is improved by this method.

The swinging erosion 51 shown in FIG. 6 represents the simulation result of the erosion formed in the case where the magnet unit 700 having a width W in the short-side direction of 120 mm is swung in the zone L having a length of 180 mm. For example, when the width in the short-side direction of the magnet unit 700 is reduced from 120 mm to 90 mm, the region A marking the largest erosion depth can be expanded and the target utilization rate can be improved. By reducing the width W of the magnet unit as described above, it is theoretically possible to expand the region A marking the largest erosion depth and to improve the target utilisation rate.

However, when the width W of the magnet unit is reduced on the basis of this theory, there is a problem that a leakage magnetic flux density on the surface of the target generated by the magnet unit is likely to be reduced, and it is therefore difficult to obtain the leakage magnetic flux density obtained prior to the change in the width W of the magnet unit.

The present invention has been made in view of the above-mentioned problem. An object of the present invention is to provide a sputtering apparatus and a magnet unit, which are capable of obtaining a sufficient leakage magnetic flux density on a surface of a target even when a width W of the magnet unit is reduced.

To attain the object, a first aspect of the present invention provides a sputtering apparatus which includes: a target holder having a target mounting surface; and a magnet unit of a rectangular shape having a long side and a short side and disposed near a surface of the target holder on an opposite side from the target mounting surface. Here, the magnet unit includes: a first magnet magnetized in a direction perpendicular to the target mounting surface; a second magnet disposed around the first magnet and magnetized in the direction perpendicular to the target mounting surface and in an opposite direction being different from the direction of magnetization of the first magnet; and a third magnet located at part between the first magnet and the second magnet in the short-side direction and at least at a center position between the first magnet and the second magnet, the third magnet being magnetized in the short-side direction. The third magnet includes: a surface facing the second magnet and having the same polarity as a polarity of a surface of the second magnet on the target holder side; and a surface facing the first magnet and having the same polarity as a polarity of a surface of the first magnet on the target holder side.

Meanwhile a second aspect of the present invention provides a magnet unit of a rectangular shape having a long side and a short side, which includes: a magnet mounting surface; a first magnet magnetized in a direction perpendicular to the magnet mounting surface; a second magnet disposed around the first magnet and magnetized in the direction perpendicular to the magnet mounting surface and in an opposite direction being different from the direction of magnetization of the first magnet; and a third magnet located at part between the first magnet and the second magnet in the short-side direction and at least at a center position between the first magnet and the second magnet, the third magnet being magnetized in the short-side direction. Here, the third magnet includes: a surface facing the second magnet and having the same polarity as a polarity of a surface of the second magnet on an opposite side from the magnet mounting surface; and a surface facing the first magnet and having the same polarity as a polarity of a surface of the first magnet on an opposite side from the magnet mounting surface.

According to the present invention, the leakage magnetic flux density on the surface of the target can be increased as compared to a conventional example. Thus, it is possible to provide a sputtering apparatus and a magnetron unit, with which a target utilisation rate is improved by reducing a width of a magnet unit.

BRIEF DESCRIPTION OF DRAWINGS

FIG. 10 is a plan view explaining dimensions of the magnet unit according to the embodiment of the present invention.

FIG. 11A is a view for explaining distances from a magnet mounting surface to respective surfaces of first to third magnets located on the opposite side from the magnet mounting surface in another embodiment of the present invention.

FIG. 11B is a view for explaining distances from the magnet mounting surface to the respective surfaces of the first to third magnets located on the opposite side from the magnet mounting surface in the other embodiment of the present invention.

FIG. 11C is a view for explaining distances from the magnet mounting surface to the respective surfaces of the first to third magnets located on the opposite side from the magnet mounting surface in the other embodiment of the present invention.

DESCRIPTION OF EMBODIMENTS

First Embodiment

A typical embodiment of the present invention will be described below on the basis of the accompanying drawings. Note that the present invention is not limited only to this embodiment and various changes are possible within the scope not departing from the gist of the present invention.

Figure 1:
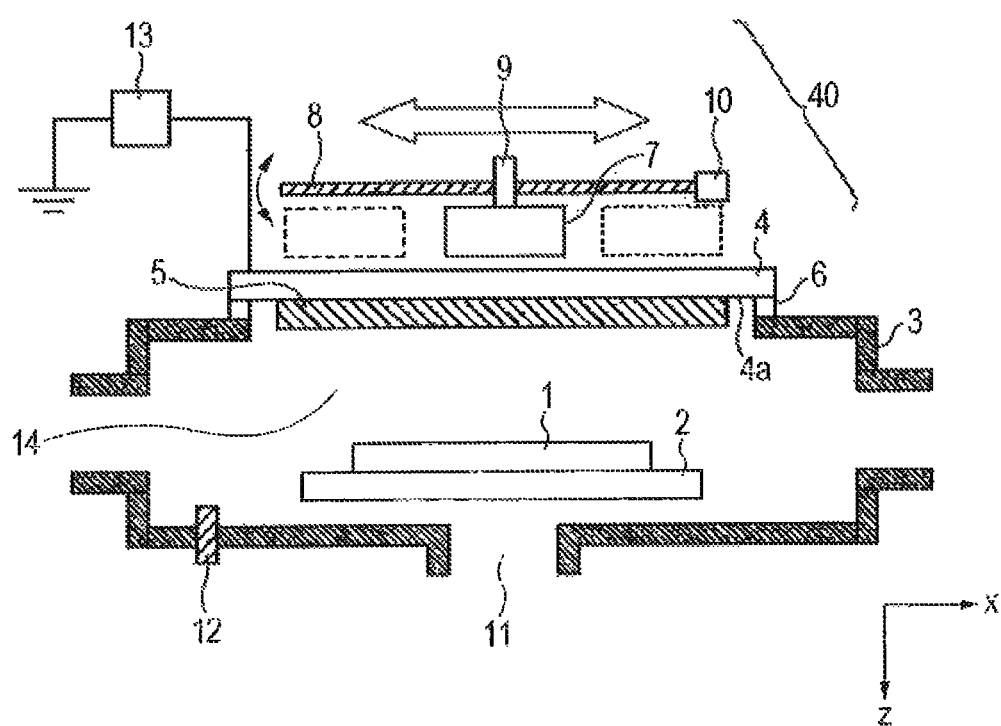
FIG. 1 is a schematic cross-sectional view explaining a configuration of a sputtering apparatus applicable to an embodiment of the present invention.

FIG. 1 is a schematic cross-sectional view explaining a configuration of a sputtering apparatus applicable to this embodiment. An x direction shown in FIG. 1 represents a short-side direction of a target 5 as well as a magnet unit 7, which is a swinging direction of the magnet unit 7.

As shown in FIG. 1, the sputtering apparatus includes a chamber 3, a magnetron cathode 40, and a substrate holder 2 as main constituents. In addition, the sputtering apparatus includes a power supply 13 for applying electric power, which is necessary for a sputter deposition process, to a target holder 4. The target holder 4 to which the target 5 is joined is attached to the chamber 3 (a vacuum chamber) through an insulator 6. The insulator 6 is a member which establishes electric insulation between the chamber 3 and the target holder 4. The chamber 3, the target holder 4, and the insulator 6 collectively form a processing chamber 14 which can achieve evacuation.

The target holder 4 is provided with a target attachment surface (a target mounting surface) 4a to which the target 5 is joined by bonding. The target attachment surface 4a is formed as a smooth surface that faces the substrate holder 2. The target 5 is a material to be deposited, which is bonded to the target attachment surface 4a of the target holder 4 as described previously.

A magnet unit (a magnetic circuit unit) 7 of a rectangular shape having a long side and a short side, which is configured to apply a magnetic field necessary for magnetron discharge, is disposed near a surface of the target holder 4 on the opposite side from the target attachment surface 4a. The magnet unit 7 is suspended from a threaded shaft 8 through a joint 9, and a motor 10 is connected to the threaded shaft 8. The threaded shaft 8 is rotated (forward and backward) by the motor 10. In other words, the joint 9 and the threaded shaft 8 collectively form a ball screw mechanism. The magnet unit 7 swings in the x direction (the short-side direction of the magnet unit 7) along with the rotation of the threaded shaft 8. By controlling the rotation of the motor 10, it is possible to control a traveling distance, a traveling speed, and a traveling direction of the magnet unit 7. In this wavy a swinging device formed from the joint 9, the threaded shaft 8, and the motor 10 can move the magnet unit 7 as illustrated wish a dashed line in FIG. 1.

While the embodiment includes the swinging device which moves the magnet unit 7 only in the short-side direction of the magnet unit 7, it is possible to provide a swinging device additionally configured to swing the magnet unit 7 in a y direction, which is a long-side direction of the magnet unit 7.

The substrate holder 2 capable of holding a substrate 1 in such a way as to face the target 5 is provided inside the chamber 3. An exhaust device such as an exhaust pump is connected to an exhaust port 11 of the chamber 3 through a not-illustrated conductance valve or the like. A gas introduction mechanism 12 provided with a mass flow controller (MFC) or the like is connected to the chamber 3 as means for introducing a process gas. The process gas is supplied from the gas introduction mechanism 12 at a predetermined flow rate. A single gas or a mixed gas containing a rare gas such as argon (Ar), nitrogen ($N_2$), and the like can be used as the process gas.

While the magnet unit 7 is disposed on the back side of the target holder 4 in this embodiment, it is also possible to adopt a configuration in which a partition plate is provided at a position between the target holder 4 and the magnet unit 7 and the partition plate is used as a vacuum partition wall. It is to be noted that in the embodiment the magnet unit 7 means a configuration at least including a first magnet 71, a second magnet 72, and third magnets (73a, 73b). In the meantime, the magnetron cathode 40 means a configuration at least including the magnet unit 7 and the target holder 4.

Figure 2:
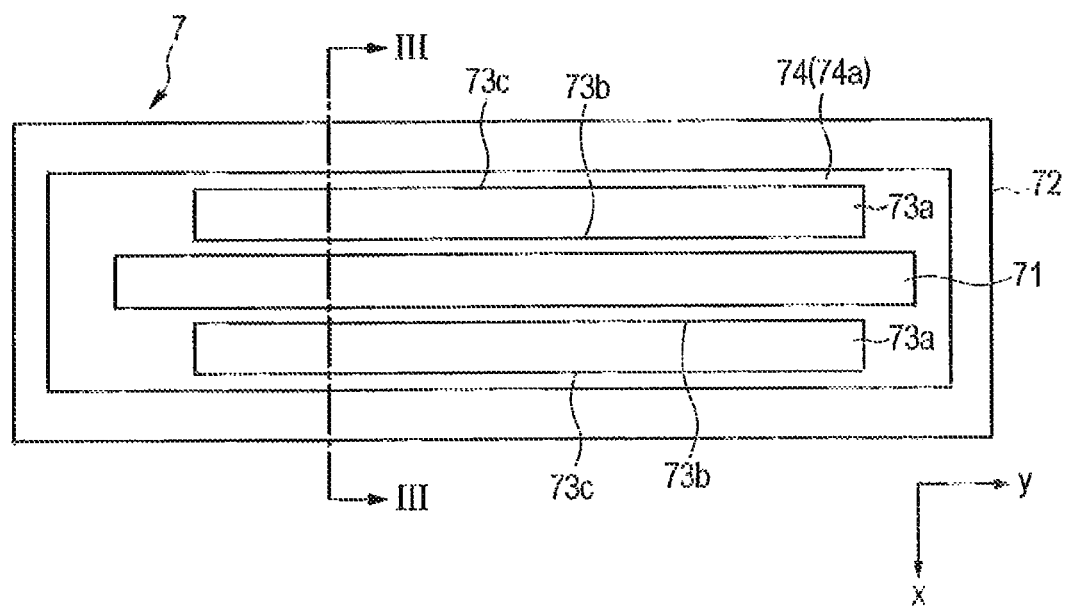
FIG. 2 is a plan view explaining details of a magnet unit according to the embodiment of the present invention.
Figure 3:
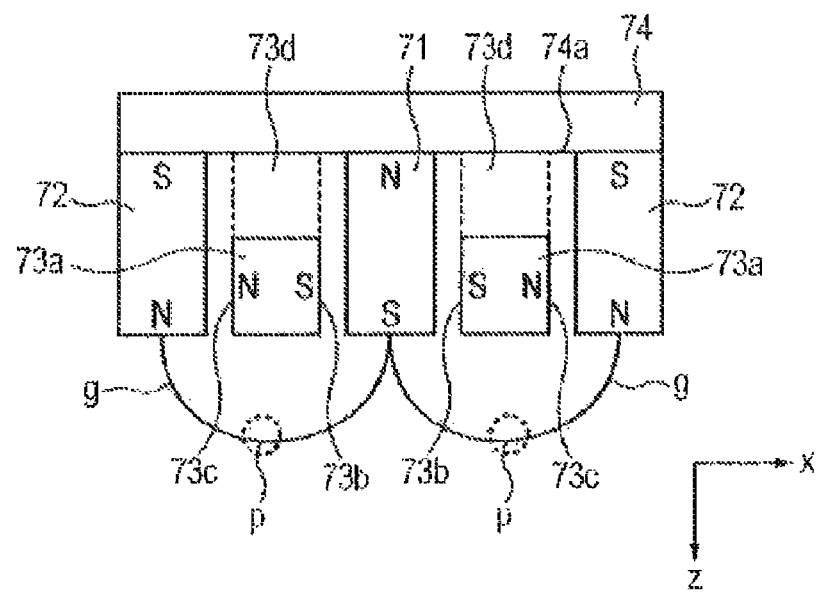
FIG. 3 is a cross-sectional view taken along the III-III line in FIG. 2.

FIG. 2 is a plan view explaining details of the magnet unit 7 of the embodiment. FIG. 3 is a cross-sectional view explaining the details of the magnet unit 7 of the embodiment, which is taken along the III-III line in FIG. 2.

The magnet unit 7 includes: the first magnet 71; the second magnet 72; the third magnets 73a; and a magnet mounting portion 74 provided with a magnet mounting surface 74a for supporting the first magnet 71, the second magnet 72, and the third magnets 73a. In the embodiment, at least the first magnet 71 and the second magnet 72 are mounted on the magnet mounting surface 74a.

Note that the long side and the short side of the magnet unit 7 are determined by the first magnet 71 and the second magnet 72.

The first magnet 71 being a permanent magnet having a bar shape, and the second magnet 72 being a permanent magnet having such a shape to surround the first magnet 71, are located away from each other and mounted on the magnet mounting portion 74. The first magnet 71 and the second magnet 72 are magnetized in a direction (a z direction) perpendicular to a target surface and the target attachment surface 4a. The polarities of the first magnet 71 and the second magnet 72 are arranged opposite to each other. In the embodiment, the first magnet 71 is provided such that its N pole is directed to the magnet mounting surface 74a side while its S pole is directed to the target holder 4 side. On the other hand, the second magnet 72 is provided such that its S pole is directed to the magnet mounting surface 74a side while its N pole is directed to the target holder 4 side. In other words, the second magnet 72 is magnetized in the opposite direction which is different from the direction of magnetization of the first magnet 71.

Meanwhile, the third magnet 73a being a permanent magnet having a bar shape is provided at part in each region between the first magnet 71 and the second magnet 72 in the shorts-side direction of the magnet unit 7, and at least at a center position between the first magnet 71 and the second magnet 72. Specifically, each third magnet 73a is provided such that the long-side direction of the third magnet 73a coincides with the long-side direction of the first magnet 71 and that the midpoint in the short-side direction of the third magnet 73a coincides with the midpoint between the first magnet 71 and the second magnet 72. Here, from another perspective, each third magnet 73a is provided along the long-side direction (the y direction) or the magnet unit 7 such that a distance between a surface 73b of the third magnet 73a on the first magnet 71 side and the first magnet 71 is equal to a distance between a surface 73c of the third magnet 73a on the second magnet 72 side and the second magnet 72. In the meantime, as shown in FIG. 2, a length in the long-side direction of each third magnet 73a is shorter than a length in the long-side direction of the first magnet 71. Accordingly, the third magnet 73a is not disposed at each end portion in the long-side direction of the first magnet 71 in the region between the first magnet 71 and the second magnet 72.

Each third magnet 73a is magnetized in a direction parallel to the target surface and the target attachment surface 4a, and in a direction (the x direction) perpendicular to the long side of the magnet unit 7. The polarity of the surface 73b of the third magnet 73a adjacent to the first magnet 71 (the surface facing the first magnet 71) has the same polarity as the polarity of the surface of the first magnet 71 facing the target holder 4 side. Meanwhile, the polarity of the surface 73c of the third magnet 73a adjacent to the second magnet 72 (the surface facing the second magnet 71) has the same polarity as the polarity of the surface of the second magnet 72 on the target holder side. From the viewpoint of generating the magnetic field necessary for the magnetron discharge with an economically advantageous method, the magnet mounting portion 74 is preferably made of a magnetic material. In addition, from the viewpoint of fixation of the first magnet 71 and the second magnet 72, it is preferable that the magnet mounting portion 74 be present. Nevertheless, the magnet mounting portion 74 may be made of a non-magnetic material when a necessary and sufficient magnetic field can be generated only by the first magnet 71, the second magnet 72, and the third magnets 73a. Moreover, in this case, the magnet mounting portion 74 need not be provided if the first magnet 71, the second magnet 72, and the third magnets 73a can be fixed relative to one another.

A support portion 73d is provided between each third magnet 73a and the magnet mounting portion 74. In the embodiment, the support portion 73d is made of aluminum, which is s non-magnetic material. Here, as long as it is possible to design a favorable magnetic circuit, the support portion 73d may be made of a magnetic material, or may be a magnet having the same direction of magnetization and the same polarity arrangement as each third magnet 73*a*. Alternatively, the third magnets 73*a* may be mounted directly on the magnet mounting portion 74 without providing the support portions 73*d*.

The embodiment explains the case in which the first magnet 71 and the second magnet 72 are directly provided on the magnet mounting portion 74. However, without limitation to the foregoing, it is also possible to provide a spacer such as the support portion 73*d* between the magnet mounting portion 74 and at least one of the first magnet 71 and the second magnet 72.

Although the above-described embodiment explains the case in which each of the third magnets 73*a* has a bar shape. Instead, the third magnet 73*a* may be a single annular magnet. In other words, in the embodiment, it is essential that the third magnet is disposed at least at part between the first magnet 71 and the second magnet 72 in the short-side direction of the first magnet 71 and the second magnet 72, and at least at the center position between the first magnet 71 and the second magnet 72.

A comparison between magnetic loops formed by the magnet unit 7 of the embodiment and magnetic loops formed by a conventional magnet unit 90 will be described by using FIG. 9.

Figure 9:
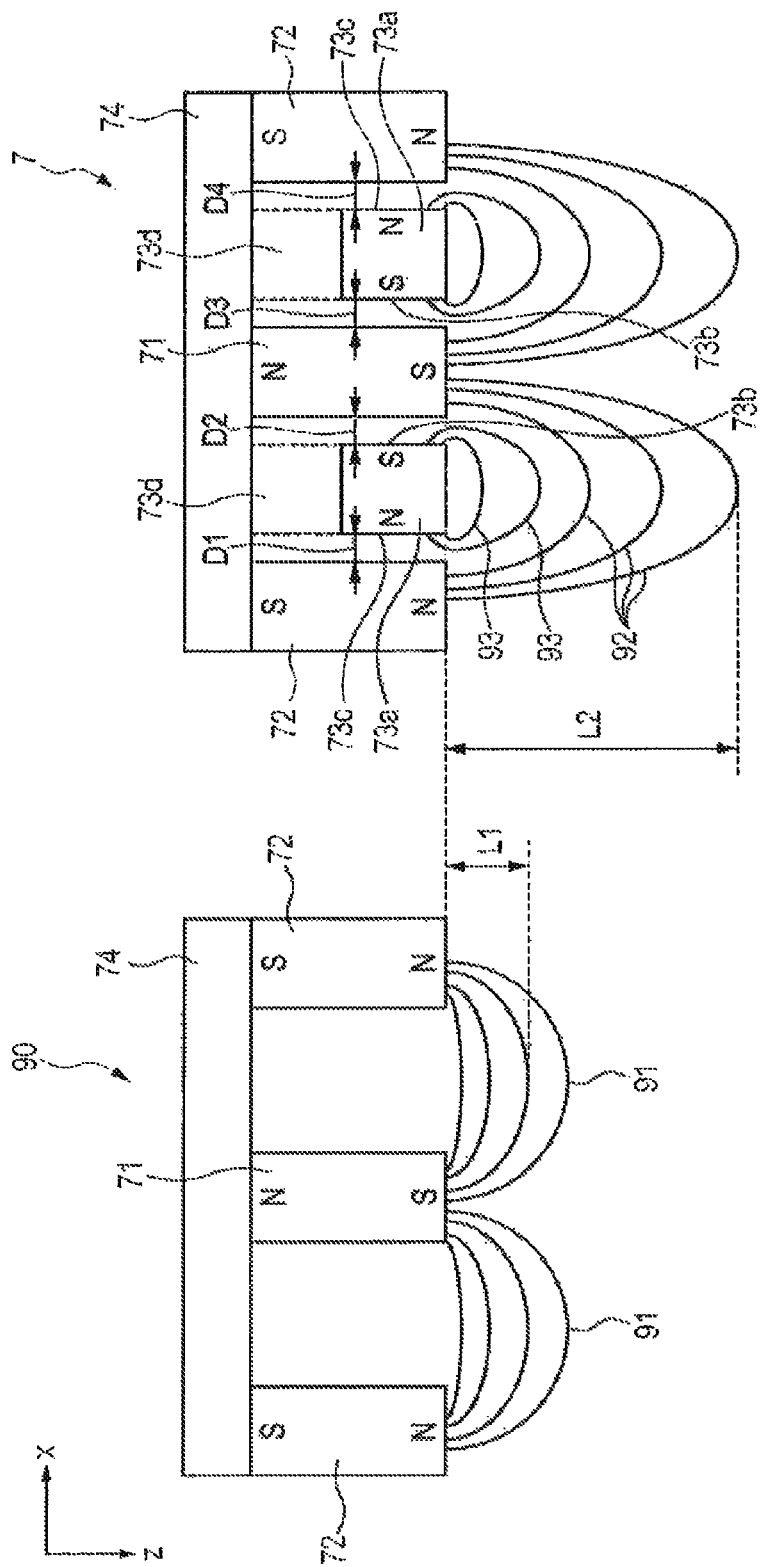
FIG. 9 illustrates views showing magnetic loops formed by a magnet unit having a conventional structure and magnetic loops formed by the magnet unit according to the embodiment of the present invention.

In FIG. 9, the magnet unit 90 of a conventional structure has a configuration in which the third magnets 73*a* and the support portions 73*d* are taken away from the magnet unit 7 of the embodiment. In the conventional magnet unit 90, lines 91 of magnetic force (magnetic loops) are formed by the N pole of the first magnet 71 being the magnetic pole on the target holder side and the S pole of the second magnet 72 being the magnetic pole on the target holder side. A distance of one of the lines 91 of magnetic force from the first magnet 71 and the second magnet 72 to a region where a magnetic field strength (a leakage magnetic flux density) becomes parallel to the target surface reaches X Gauss (X: arbitrary) is defined as a distance L1.

In the magnet unit 7 of the embodiment, while lines 92 of magnetic force (magnetic loops) are formed by the first magnet 71 and the second magnet 72 as in the case of the conventional magnet unit 90, lines 93 of magnetic force (magnetic loops) are further formed by the N pole and the S pole of each third magnet 73*a* in the inside of the corresponding lines 92 of magnetic force (on the first magnet 71 side and the second magnet 72 side). In the embodiment, the lines 92 of magnetic force emitted from the K pole of the second magnet 72 and the lines 93 of magnetic force emitted from the N pole of the third magnet 73*a* repel one another. For this reason, the lines 92 of magnetic force emitted from the N pole of the second magnet 72 enter the S pole of the first magnet 71 in such a way as to make a detour around the lines 93 of magnetic force formed by the third magnet 73*a*. As a consequence, it is possible to form the magnetic loops farther from the magnet unit as compared to the case of the conventional magnet unit 90.

Specifically, in the embodiment, each third magnet 73*a* is provided between the first magnet 71 and the second magnet 72 such that: the lines 93 of magnetic force emitted from the surface 73*c* (the N pole of the third magnet) facing the second magnet 72 to the target side enter the surface 73*b* (the S pole of the third magnet) facing the first magnet 71; the polarity of the surface 73*c* is of the same polarity as the magnetism of a region of the second magnet 72 facing the surface 73*c*; and the polarity of the surface 73*b* is of the same polarity as the magnetism of the first magnet 71 facing the surface 73*b*. Thus, the lines 93 of magnetic force, which repel the lines 92 of magnetic force formed by the first magnet 71 and the second magnet 72, can be formed inside the lines 92 of magnetic force. By the existence of the above-described lines 93 of magnetic force repelling the lines 92 of magnetic force, it is possible to form the lines 92 of magnetic force, which concern the leakage magnetic flux density, far from the magnet unit 7. In other words, it is possible to render a distance L2 of one of the lines 92 of magnetic force, concerning the leakage magnetic flux density, from the first magnet 71 and the second magnet 72 to a region where the magnetic field strength becomes parallel to the target surface reaches X Gauss mentioned above, greater than the distance L1 in the conventional magnet unit 90. As described above, in the embodiment, the third magnet 73*a* provided such that the magnetic loops (the lines 93 of magnetic force) generated by the third magnet 73*a* repel the magnetic loops (the lines 92 of magnetic force) generated by the first magnet 71 and the second magnet 72, can cause the lines 92 of magnetic force concerning the leakage magnetic flux density to be formed at a position located farther from the magnet unit 7, so that the third magnet 73*a* can form the magnetic loops that can obtain a predetermined leakage magnetic flux density farther from the magnet unit 7 than that in the case of the conventional magnet unit. In this way, according to the embodiment, since the lines 92 of magnetic force concerning the leakage magnetic flux density can be formed farther from the magnet unit 7, it is possible to obtain a sufficient leakage magnetic flux density on the target surface even when a width W in the short-side direction of the magnet unit 7 is reduced.

Here, the effect of forming the magnetic loops sufficiently far as described above can be expected as long as each third magnet 73*a* is located at the center between the first magnet 71 and the second magnet 72. In addition, each third magnet 73*a* is provided such that the midpoint in the short-side direction of the third magnet 73*a* coincides with the midpoint between the first magnet 71 and the second magnet 72, whereby a distance D1 (D4) between the surface 73*c* of the third magnet 73*a* facing the second magnet 72 and the second magnet 72 can be set equal to a distance D2 (D3) between the surface 73*b* of the third magnet 73*a* facing the first magnet 71 and the first magnet 71. Thus, it is possible to equalize the action of the N pole of the second magnet 72 on the lines 93 of magnetic force and the action of the S pole of the first magnet 71 on the lines 93 of magnetic force. As a consequence, the lines 93 of magnetic force formed on the target side of each third magnet 73*a* can be shaped more symmetric, and the lines 92 of magnetic force that receive the repelling action of the lines 93 of magnetic force are also formed into more symmetric shapes. It is therefore possible to form the region where the predetermined leakage magnetic flux density is obtainable at a farther location.

It is to be noted that although each third magnet 73*a* is preferably provided such that the midpoint in the short-side direction of the third magnet 73*a* coincides with the midpoint between the first magnet 71 and the second magnet 72 in the embodiment, the effect of the present invention can also be obtained by providing each third magnet 73*a* at a position displaced from the position where the midpoints coincide with each other. In other words, in the present invention, it is important to provide each third magnet 73*a* that is characteristic in the present invention at least at the center position between the first magnet 71 and the second magnet 72 in order to form the lines 92 or magnetic force, which concern the leakage magnetic flux density, as far from the magnet unit 7 as possible. Accordingly, the magnet unit 7 displaced from the above-described position in the middle is also included in the embodiment of the present invention as long as each third magnet 73a therein forms the lines 93 of magnetic force in the inside (the magnet unit 7 side) of the lines 92 of magnetic force so as to repel the lines 92 of magnetic force, whereby the position to form the lines 92 of magnetic force can be located farther from the magnet unit 7.

Furthermore, in the embodiment, it is preferable to set the distances D1, D2, D3, and D4 equal to or below 5 mm, respectively. When the distances D1 to D4 are equal to or below 5 mm, it is possible to cause the same poles on the first magnet 71 as well as the second magnet 72 and on the third magnet 73a to repel one another sufficiently. The lines 93 of magnetic force emitted from the N pole of each third magnet 73a strongly repel the N pole of the second magnet 72 located very close, thereby forming the lines 93 of magnetic force farther on the target side. For this reason, the lines 92 of magnetic force emitted from the N pole of the first magnet 71 are pushed up by the lines 93 of magnetic force formed farther as described above. As a result, the lines 92 of magnetic force are formed farther on the target side. In other words, by providing a sufficiently large width of the third magnet 73a (the width of the third magnet 73a in the short-side direction (the x direction) of the magnet unit 7), it is possible to cause the third magnet 73a to repel the first magnet 71 as well as the second magnet 72 sufficiently, and to use the lines 93 of magnetic force from the third magnet 73a thus repelling to form the lines 92 of magnetic force concerning the leakage magnetic flux density farther on the target side. Note that in the embodiment, the third magnet 73a may be in contact with at least one of the first magnet 71 and the second magnet 72. In this context, it is preferable to set each of the above-described distances D1 to D4 in a range from 0 mm to 5 mm inclusive.

Here, in the embodiment, the magnet mounting portion 74 may be either a plate-like yoke or a plate-like non-magnetic material. When the magnet mounting portion 74 is the yoke as described above, it is possible to form the magnetic loops, which form the predetermined leakage magnetic flux density, even farther from the magnet unit 7.

Meanwhile, in the embodiment, each third magnet 73a is the permanent magnet having the bar shape, and the long-side direction of the bar-shaped third magnet 73a is aligned with the long-side direction of the first magnet 71. Accordingly, it is possible to reduce a sputtered amount of end portions in a long-side direction (a longitudinal direction) of the target and thereby to extend the life of the target. Thus, the use efficiency of the target can be improved by delaying the time when the end portions in the long-side direction of the target are deeply chipped off and extending the life of the target.

In the meantime, in FIG. 10, it is preferable to set a length a in the long-side direction of the bar-shaped first magnet 71 equal to or above a length b in the long-side direction of the bar-shaped third magnet 73a. In this way, it is possible to reduce the sputtered amount of the end portions in the long-side direction of the target. Thus, the life of the target can be extended and the use efficiency thereof can be improved. Furthermore, it is preferable to set a distance (an interval) α between the first magnet 71 and the second magnet 72 in the short-side direction of the magnet unit 7 equal to or above a distance (an interval) β between the first magnet 71 and the second magnet 72 in the long-side direction of the magnet unit 7. In this ways it is possible to set a width of erosion at a location in a region B in FIG. 10 smaller than a width of erosion at a location in a region C therein. Accordingly, a proportion of an amount chipped off at a location in a region A1 to an amount chipped off at a location in a region A2 can be reduced. This effect is more significant as the distance β becomes smaller than the distance α. Since the proportion can be made smaller as described above, it is possible to extend the life of the target and to improve the use efficiency thereof.

EXAMPLE

The size, the shape, and the material of the target 5 in this example are as follows. Specifically, the target 5 is made of aluminum (A1050) of a rectangular shape with a length in the short-side direction (the x direction) being its width equal to 300 mm, a length in the long-side direction (the y direction) equal to 1700 mm, and its thickness (the z direction) is equal to 15 mm. In the meantime, the target holder 4 has a thickness (the z direction) equal to 20 mm. The size of the magnet unit 7 is defined as a rectangle with a length in the short-side direction (the x direction) being its width equal to 90 mm and a length in the long-side direction (the y direction) equal to 1700 mm. Each of the first magnet 71, the second magnet 72, and the third magnets 73a is a neodymium magnet having a remnant magnetic flux density of 1.39 T and a coercivity of 12.8 kOe. Meanwhile, the magnet mounting portion 74 is made of SUS430.

A distance from a surface of the magnet unit 7 on the target holder 4 side to a sputter surface of the target 5 is equal to 39 mm. A code g in FIG. 3 shows a line of magnetic force of a magnetic field generated by the magnet unit 7. A portion of the target 5 at a location indicated with a code p (a location where the line g of magnetic force becomes parallel to the target surface), which corresponds to a peak of the curved line of magnetic force, is most likely to be sputtered. The leakage magnetic flux density in the short-side direction (the x direction) of the magnet unit 7 at the location p was equal to about 510 Gauss.

Figure 7:
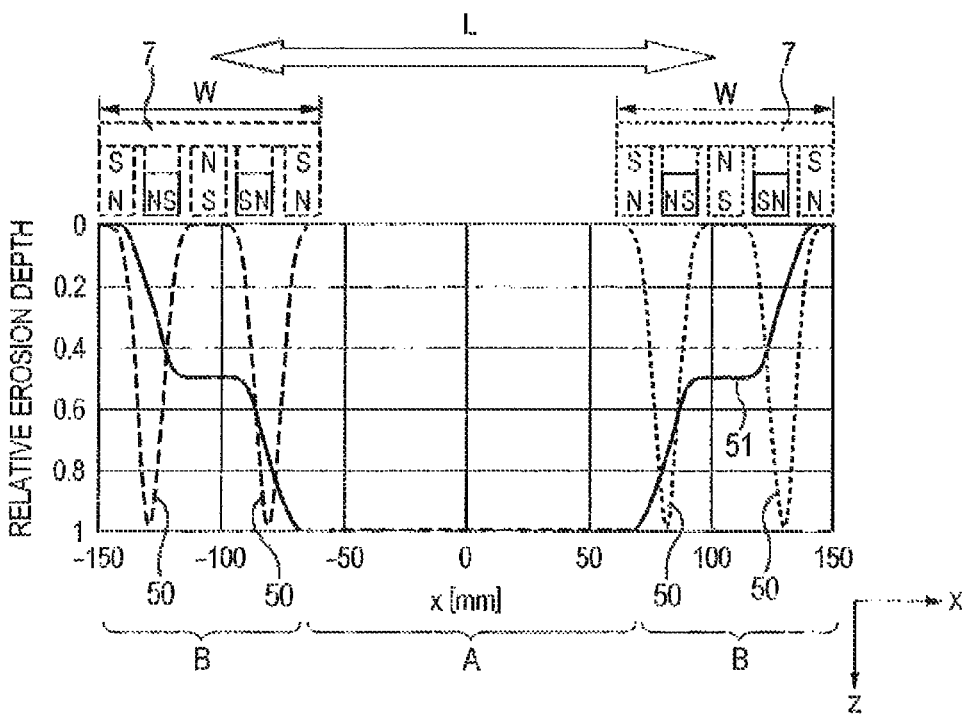
FIG. 7 is a cross-sectional view showing simulation results of stationary erosion and swinging erosion formed in a target when a width in a short-side direction of the magnet unit according to the embodiment of the present invention is equal to 90 mm.

A traveling distance of the magnet unit 7 in this example is equal to 210 mm and time required for one reciprocating motion is equal to 10 seconds. FIG. 7 is a view showing simulation results of stationary erosion 50 and swinging erosion 51 in this example. A target utilisation rate in the simulation was equal so 69%. In the meantime, a target utilisation rate made available by measuring the swinging erosion 51 obtained by actually sputtering the target 5 was equal to 65%. A coordinate measuring machine equipped with a laser displacement meter which performs non-contact measurement was used for measuring the swinging erosion 51.

Comparative Examples

Figure 8A:
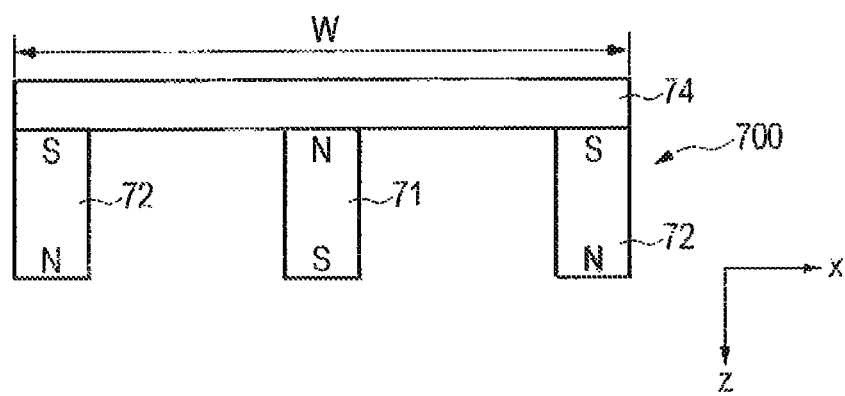
FIG. 8A is a cross-sectional view explaining a conventional magnet unit, which includes a first magnet, a second magnet, and a yoke made of a plate-like magnetic material and serving as a magnet mounting portion.
Figure 8B:
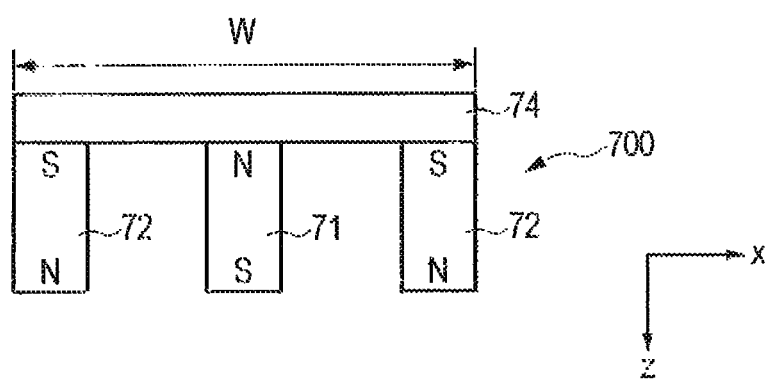
FIG. 8B is a cross-sectional view explaining a conventional magnet unit, which includes a first magnet, a second magnet, and a yoke made of a plate-like magnetic material and serving as a magnet mounting portion.
Figure 8C:
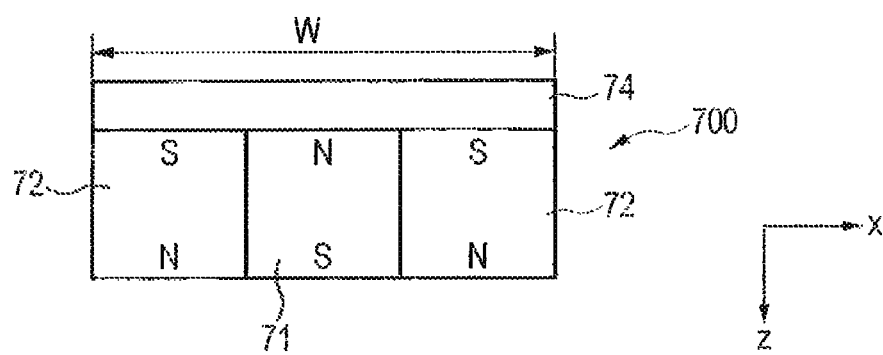
FIG. 8C is a cross-sectional view explaining a conventional magnet unit, which includes a first magnet, a second magnet, and a yoke made of a plate-like magnetic material and serving as a magnet mounting portion.

Magnetic fields generated by magnet units 700 of the related art shown in FIGS. 8A to 8C and target utilization rates thereof were investigated in conjunction with carrying out the present invention.

Figure 4:
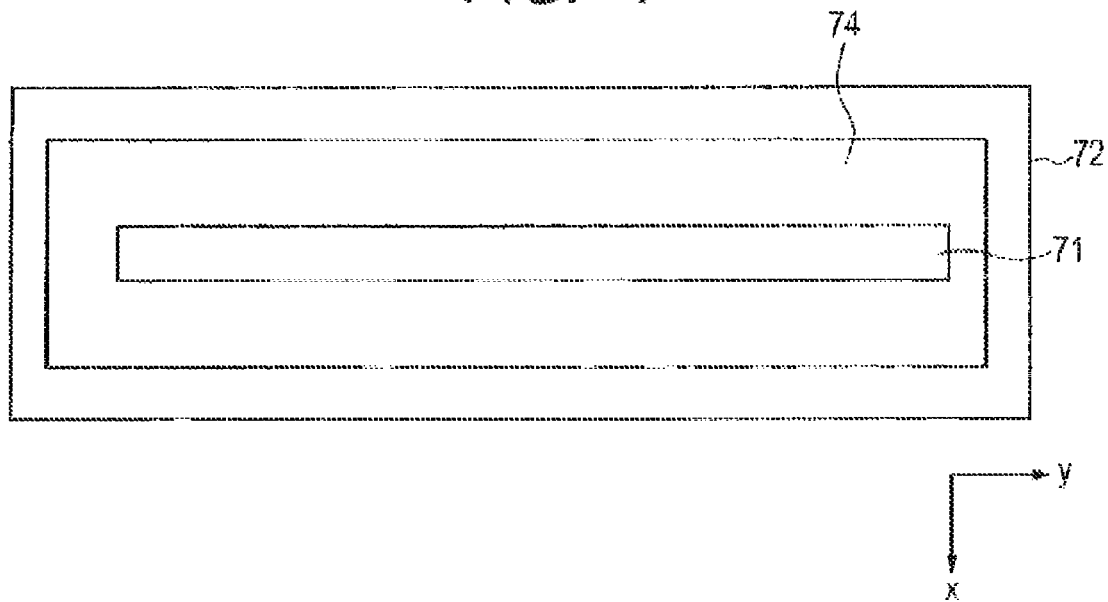
FIG. 4 is a plan view explaining a conventional magnet unit, which includes a first magnet, a second magnet, and a yoke made of a plate-like magnetic material and serving as a magnet mounting portion.
Figure 5A:
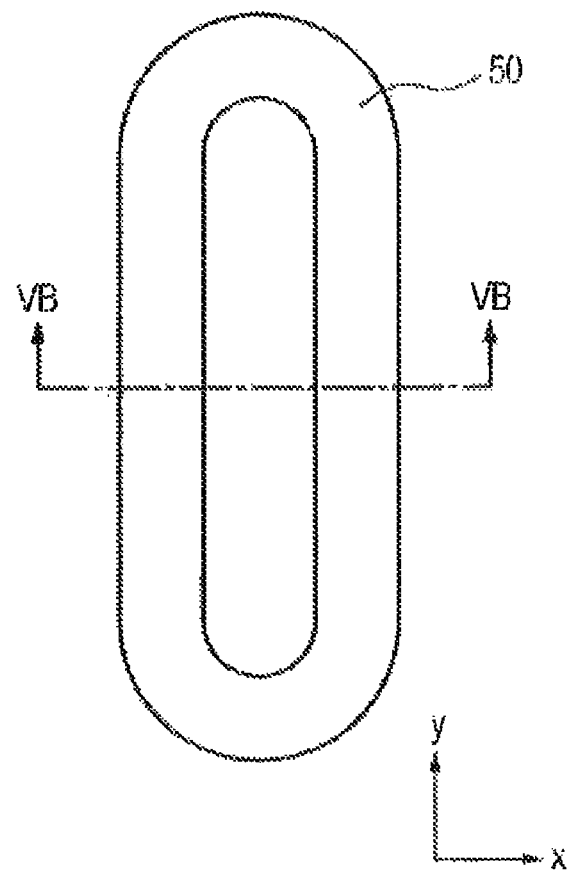
FIG. 5A is a schematic plan view of ring-shaped erosion formed by a magnet unit having a substantially rectangular shape.
Figure 5B:
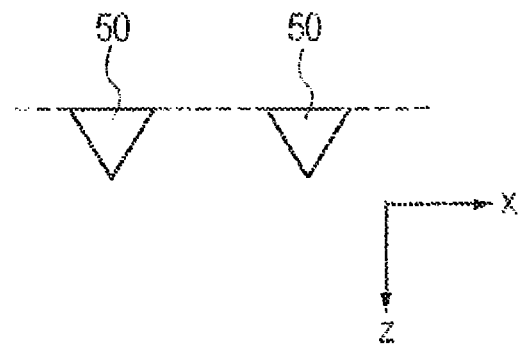
FIG. 5B is a cross-sectional view taken along the VB-VB line in FIG. 5A.

FIG. 4 is a plan view showing each magnet unit 700 of the related art. FIGS. 8A to 8C are cross-sectional views explaining details of the magnet units 700 of the related art.

In each of the conventional magnet units 700, a first magnet 71 being a permanent magnet and having a bar shape, and a second magnet 72 having such a shape to surround the first magnet 71, are mounted on a magnet mounting portion 74 which is a yoke. The first magnet 71 and the second magnet 72 are magnetized in a direction (the z direction) perpendicular to a target surface and a target mounting surface. The polarities of the first magnet 71 and the second magnet 72 are arranged opposite to each other.

Comparative Example 1

The size of the magnet unit 700 shown in FIG. 8A is defined as a rectangle with a length W in the short-side direction (the x direction) being its width equal to 120 mm and a length in the long-side direction (the y direction) equal to 1700 mm. In other words, the magnet unit of this comparative example 1 has the structure described with reference to FIG. 6. Each of she first magnet 71 and the second magnet 72 is a neodymium magnet having a remnant magnetic flux density of 1.39 T and a coercivity of 12.8 kOe. Meanwhile, the magnet mounting portion 74 is made of SUS430.

A distance from a surface of the magnet unit 700 of the comparative example 1 on a target holder side to a sputter surface of a target is equal to 39 mm, which is the same as the example. A leakage magnetic flux density in the short-side direction (the x direction) of the magnet unit 700 at a location where a portion of the target located there is most likely to be sputtered, as described in the example and indicated with the code p in FIG. 3, was equal to about 520 Gauss.

Figure 6:
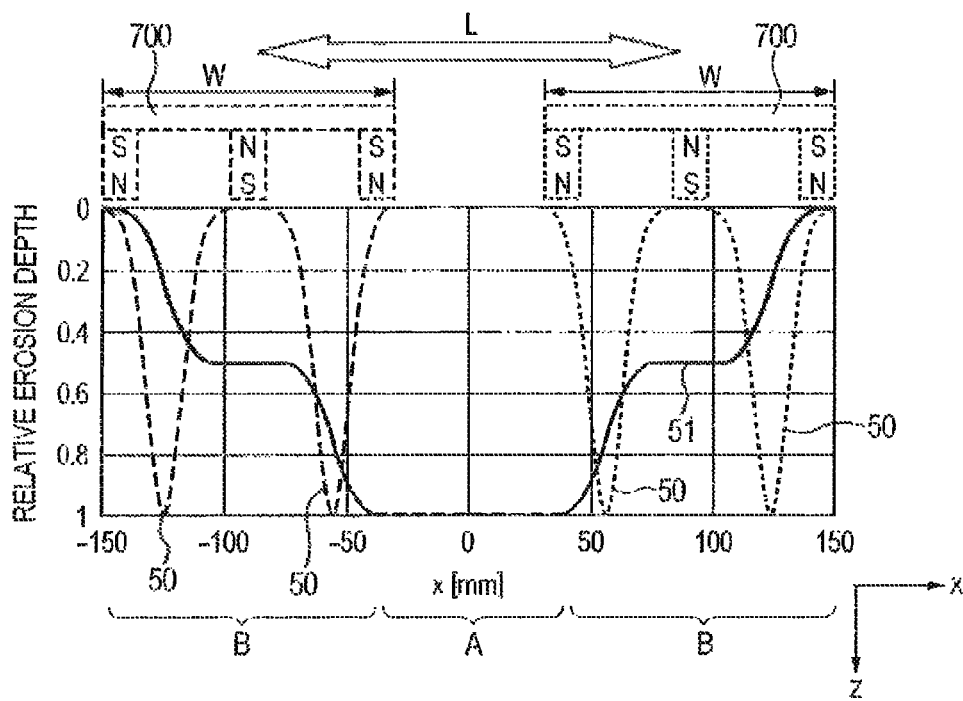
FIG. 6 is a cross-sectional view showing simulation results of stationary erosion and swinging erosion formed in a target when a width in a short-side direction of the magnet unit is equal to 120 mm.

A traveling distance of the magnet unit 700 in the comparative example 1 is equal to 180 mm and time required for one reciprocating motion is equal to 10 seconds. FIG. 6 shows simulation results of stationary erosion 50 and swinging erosion 51 in the comparative example 1. A target utilization rate in the simulation was equal to 58%. On the other hand, the target utilisation rate in the example was equal to 69%. Hence, it is apparent that the target utilisation rate can be improved by the example.

Comparative Example 2

The size of the magnet unit 700 shown in FIG. 8B is defined as a rectangle with a length W in the short-side direction (the x direction) being its width equal to 90 mm and a length in the long-side direction (the y direction) equal to 1700 mm. Meanwhile, the sizes of the first magnet 71 and the second magnet 72 are the same as those of the first magnet 71 and the second magnet 72 shown in the comparative example 1, respectively. In other words, the distances from the first magnet 71 to the second magnet 72 are different between FIG. 8A and FIG. 8B in accordance with the difference in the width W of the magnet unit 7. Each of the first magnet 71 and the second magnet 72 is a neodymium magnet having a remnant magnetic flux density of 1.39 T and a coercivity of 12.8 kOe. Meanwhile, the magnet mounting portion 74 is made of SUS430.

A distance from a surface of the magnet unit 700 of the comparative example 2 on a target holder side to a sputter surface of a target is equal to 39 mm, which is the same as the example and the comparative example 1. A leakage magnetic flux density in the short-side direction (the x direction) of the magnet unit 700 at a location where a portion of the target located there is most likely to be sputtered, as described in the example and indicated with the code p in FIG. 3, was equal to about 330 Gauss. It was unable to achieve 500 Gauss or above as obtained in the example and the comparative example 1. Accordingly, it is apparent from a comparison between the example and the comparative example 2 that, according to the example, the leakage magnetic flux density at the predetermined distance away from the magnet unit can be increased even when the width in the short-side direction of the magnet unit is reduced.

Comparative Example 3

The size of the magnet unit 700 shown in FIG. 8C is defined as a rectangle with a length W in the short-side direction (the x direction) being its width equal to 90 mm and a length in the long-side direction (the y direction) equal to 1700 mm. The sizes of the first magnet 71 and the second magnet 72 are different from those of FIG. 8A shown in the comparative example 1 and those of FIG. 8B shown in the comparative example 2. Here, the first magnet 71 and the second magnet 72 are maximized without separating from each other. In other words, this example has the shape that can obtain the maximum leakage magnetic flux density available in the related art. Each of the first magnet 71 and the second magnet 72 is a neodymium magnet having a remnant magnetic flux density of 1.39 T and a coercivity of 12.8 kOe. Meanwhile, the magnet mounting portion 74 is made of SUS430.

A distance from a surface of the magnet unit 700 of the comparative example 3 on a target holder side to a sputter surface of a target is equal to 30 mm, which is the same as the example and the comparative examples 1 and 2. A leakage magnetic flux density in the short-side direction (the x direction) of the magnet unit 700 at a location whence a portion of the target located there is most likely to be sputtered, as described in the example and indicated with the code p in FIG. 3, was equal to about 440 Gauss. It was unable to achieve 500 Gauss or above as obtained in the example and the comparative example 1.

Second Embodiment

This embodiment describes cases of changing distances from the magnet mounting surface 74a to surfaces of the first magnet 71, the second magnet 72, and each third magnet 73a on the opposite side from the magnet mounting surface 74a (lengths of remaining distances to the target mounting surface).

In each case, a leakage magnetic field formed on the target surface was investigated by means of simulation. As a result, it was possible to increase the strength of the leakage magnetic field on the target surface, i.e., to form the magnetic loops at a farther location in each of positional relations shown in FIGS. 11A to 11C. In FIGS. 11A to 11C, a first distance from the magnet mounting surface 74a to the surface of the first magnet 71 on the opposite side from the magnet mounting surface 74a is denoted as Da. A second distance from the magnet mounting surface 74a to the surface of the second magnet 72 on the opposite side from the magnet mounting surface 74a is denoted as Db. A third distance from the magnet mounting surface 74a to the surface of each third magnet 73a on the opposite side from the magnet mounting surface 74a is denoted as Dc. Here, even when a spacer is provided between the first magnet 71 and the magnet mounting surface 74a or between the second magnet 72 and the magnet mounting surface 74a, each of the first distance Da and the second distance Db is determined by the distance from the magnet mounting surface 74a to the surface of the first or second magnet on the opposite side from the magnet mounting surface 74a.

FIG. 11A shows an aspect in which all of the first distance Da, the second distance Db, and the third distance Dc are equal. Meanwhile, FIG. 11B shows an aspect in which the first distance Da and the third distance Dc are equal while the second distance Db is smaller than the third distance Dc. Furthermore, FIG. 11C shows an aspect in which the second distance Db and the third distance Dc are equal while the first distance Da is smaller than the third distance Dc. In other words, in the embodiment, it can be said that it is essential to set the lengths of the first distance and the second distance equal to or below the third distance, and to set at least one of the first distance and the second distance equal to the third distance.

The invention claimed is:

1. A sputtering apparatus comprising:
   a target holder including a target mounting surface; and
   a magnet unit of a rectangular shape disposed near an opposite surface of the target holder from the target mounting surface, and having a long side and a short side,
   wherein the magnet unit includes:
      a first magnet magnetized in a direction perpendicular to the target mounting surface,
      a second magnet disposed surrounding the first magnet and magnetized in the direction perpendicular to the target mounting surface and in a different and opposite direction from the direction of magnetization of the first magnet, and
      a third magnet located at part between the first magnet and the second magnet in the short-side direction and at least at a center position between the first magnet and the second magnet, the third magnet being magnetized in the short-side direction and in a direction horizontal to the target mounting surface,
   wherein the third magnet includes:
      a surface facing the second magnet and having the same polarity as a polarity of a surface of the second magnet on the target holder side, and
      a surface facing the first magnet and having the same polarity as a polarity of a surface of the first magnet on the target holder side, and
   wherein a length in the long-side direction of the third magnet is shorter than a length in the long-side direction of the first magnet such that the third magnet is not disposed at an end portion in the long-side direction between the first magnet and the second magnet.

2. The sputtering apparatus according to claim 1, wherein the magnet unit further comprises a magnet mounting surface located on an opposite side from the target holder and designed to mount the first magnet and the second magnet,
   a first distance from the magnet mounting surface to a surface of the first magnet on an opposite side from the magnet mounting surface and a second distance from the magnet mounting surface to a surface of the second magnet on an opposite side from the magnet mounting surface each have a length equal to or below a third distance from the magnet mounting surface to a surface of the third magnet on an opposite side from the magnet mounting surface, and
   at least one of the first distance and the second distance is equal to the third distance.

3. The sputtering apparatus according to claim 1, wherein a distance between the surface facing the second magnet and the second magnet and a distance between the surface facing the first magnet and the first magnet are each equal to or below 5 mm.

4. A sputtering apparatus comprising:
   a target holder including a target mounting surface; and
   a magnet unit of a rectangular shape disposed near an opposite surface of the target holder from the target mounting surface, and having a long side and a short side,
   wherein the magnet unit includes:
      a first magnet magnetized in a direction perpendicular to the target mounting surface,
      a second magnet disposed surrounding the first magnet and magnetized in the direction perpendicular to the target mounting surface and in a different and opposite direction from the direction of magnetization of the first magnet, and
      a third magnet located at part between the first magnet and the second magnet in the short-side direction and at least at a center position between the first magnet and the second magnet, the third magnet being magnetized in the short-side direction and in a direction horizontal to the target mounting surface,
   wherein the third magnet includes:
      a surface facing the second magnet and having the same polarity as a polarity of a surface of the second magnet on the target holder side, and
      a surface facing the first magnet and having the same polarity as a polarity of a surface of the first magnet on the target holder side, and
   wherein an interval between the first magnet and the second magnet in the long-side direction is shorter than an interval between the first magnet and the second magnet in the short-side direction.

5. The sputtering apparatus according to claim 1, wherein the magnet unit further comprises a plate-like yoke located on an opposite side from the target holder and designed to mount the first magnet and the second magnet.

6. The sputtering apparatus according to claim 1, wherein the magnet unit further comprises a plate-like non-magnetic material located on an opposite side from the target holder and designed to mount the first magnet and the second magnet.

7. A magnet unit of a rectangular shape having a long side and a short side comprising:
   a magnet mounting surface;
   a first magnet magnetized in a direction perpendicular to the magnet mounting surface;
   a second magnet disposed surrounding the first magnet and magnetized in the direction perpendicular to the magnet mounting surface and in a different and opposite direction from the direction of magnetization of the first magnet; and
   a third magnet located at part between the first magnet and the second magnet in the short-side direction and at least at a center position between the first magnet and the second magnet, the third magnet being magnetized in the short-side direction and in a direction horizontal to the target mounting surface,
   wherein the third magnet includes:
      a surface facing the second magnet and having the same polarity as a polarity of a surface of the second magnet on an opposite side from the magnet mounting surface, and
      a surface facing the first magnet and having the same polarity as a polarity of a surface of the first magnet on an opposite side from the magnet mounting surface, and
   wherein a length in the long-side direction of the third magnet is shorter than a length in the long-side direction of the first magnet such that the third magnet is not disposed at an end portion in the long-side direction between the first magnet and the second magnet.

8. The magnet unit according to claim 7, wherein a first distance from the magnet mounting surface to a surface of the first magnet on an opposite side from the magnet mounting surface and a second distance from the magnet mounting surface to a surface of the second magnet on an opposite side from the magnet mounting surface each have a length equal to or below a third distance from the magnet mounting surface to a surface of the third magnet on an opposite side from the magnet mounting surface, and
   at least one of the first distance and the second distance is equal to the third distance.

9. The magnet unit according to claim 7, wherein a distance between the surface facing the second magnet and the second magnet and a distance between the surface facing the first magnet and the first magnet are each equal to or below 5 mm.

10. A magnet unit of a rectangular shape having a long side and a short side comprising:
   a magnet mounting surface;
   a first magnet magnetized in a direction perpendicular to the magnet mounting surface;
   a second magnet disposed surrounding the first magnet and magnetized in the direction perpendicular to the magnet mounting surface and in a different and opposite direction from the direction of magnetization of the first magnet; and
   a third magnet located at part between the first magnet and the second magnet in the short-side direction and at least at a center position between the first magnet and the second magnet, the third magnet being magnetized in the short-side direction and in a direction horizontal to the target mounting surface,
   wherein the third magnet includes:
      a surface facing the second magnet and having the same polarity as a polarity of a surface of the second magnet on an opposite side from the magnet mounting surface, and
      a surface facing the first magnet and having the same polarity as a polarity of a surface of the first magnet on an opposite side from the magnet mounting surface, and
   wherein an interval between the first magnet and the second magnet in the long-side direction is shorter than an interval between the first magnet and the second magnet in the short-side direction.

11. The magnet unit according to claim 7, further comprising a plate-like yoke designed to mount the first magnet and the second magnet.

12. The magnet unit according to claim 7, further comprising a plate-like non-magnetic material designed to mount the first magnet and the second magnet.

13. The sputtering apparatus according to claim 1, wherein each of the first magnet and the third magnet is a magnet having a bar shape.

14. The magnet unit according to claim 7, wherein each of the first magnet and the third magnet is a magnet having a bar shape.

* * * * *